(12) United States Patent
Fan et al.

(10) Patent No.: US 9,148,976 B2
(45) Date of Patent: Sep. 29, 2015

(54) RAIL MOUNTING MECHANISM

(71) Applicant: HON HAI PRECISION INDUSTRY CO., LTD., New Taipei (TW)

(72) Inventors: Chen-Lu Fan, New Taipei (TW); Li-Ping Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 131 days.

(21) Appl. No.: 14/081,178

(22) Filed: Nov. 15, 2013

(65) Prior Publication Data

US 2014/0314348 A1    Oct. 23, 2014

(30) Foreign Application Priority Data

Apr. 18, 2013  (CN) .......................... 2013 1 01350525

(51) Int. Cl.
*H05K 7/14* (2006.01)

(52) U.S. Cl.
CPC .................................... *H05K 7/1489* (2013.01)

(58) Field of Classification Search
CPC ............. A47B 88/0418; A47B 88/044; A47B 2210/0059
See application file for complete search history.

(56) References Cited

U.S. PATENT DOCUMENTS

| | | | | |
|---|---|---|---|---|
| 6,948,691 B2 * | 9/2005 | Brock et al. | ............. | 248/222.13 |
| 7,192,103 B2 * | 3/2007 | Hamilton | ................... | 312/334.5 |
| 7,798,582 B2 * | 9/2010 | Yu et al. | ..................... | 312/334.4 |
| 7,950,753 B2 * | 5/2011 | Liang | ......................... | 312/334.4 |
| 2003/0107309 A1 * | 6/2003 | Lauchner | ................... | 312/334.5 |
| 2003/0111436 A1 * | 6/2003 | Basinger et al. | ............... | 211/183 |
| 2004/0217073 A1 * | 11/2004 | Dobler et al. | ................... | 211/26 |
| 2008/0284300 A1 * | 11/2008 | Wu et al. | ..................... | 312/334.1 |
| 2008/0303390 A1 * | 12/2008 | Hsiung et al. | ............... | 312/223.1 |
| 2010/0072153 A1 * | 3/2010 | Chen et al. | ..................... | 211/183 |
| 2011/0192946 A1 * | 8/2011 | Yu et al. | ..................... | 248/222.11 |
| 2011/0240580 A1 * | 10/2011 | Yu et al. | ......................... | 211/183 |
| 2012/0076446 A1 * | 3/2012 | Chen et al. | ....................... | 384/21 |

* cited by examiner

*Primary Examiner* — Hanh V Tran
(74) *Attorney, Agent, or Firm* — Novak Druce Connolly Bove + Quigg LLP

(57) ABSTRACT

A rail mounting mechanism includes a support, a guide way, a sliding member, and a positioning member. The guide way is configured for slidably receiving a rail and includes a guide body and a mounting piece located on the guide body. The mounting piece is detachably engaged with the support. The sliding member is slidably installed on an outer surface of the guide body and includes a sliding body and an arm piece extending from the sliding body. A resilient member is secured to the sliding body and the guide body. The positioning member is secured to an inner surface of the guide body and includes a side flange. The sliding member is slidable between a first position and a second position.

20 Claims, 5 Drawing Sheets

RAIL MOUNTING MECHANISM

BACKGROUND

1. Technical Field

The present disclosure relates to mounting mechanisms, and more particularly to a rail mounting mechanism in a server.

2. Description of Related Art

Server racks include a plurality of rails to secure a plurality of server chassis, each of which receives a plurality of electronic elements, such as circuit boards, disk drives, expansion cards, or the like. The plurality of rails is usually secured to a pair of supports by screws, which is very inconvenient. Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
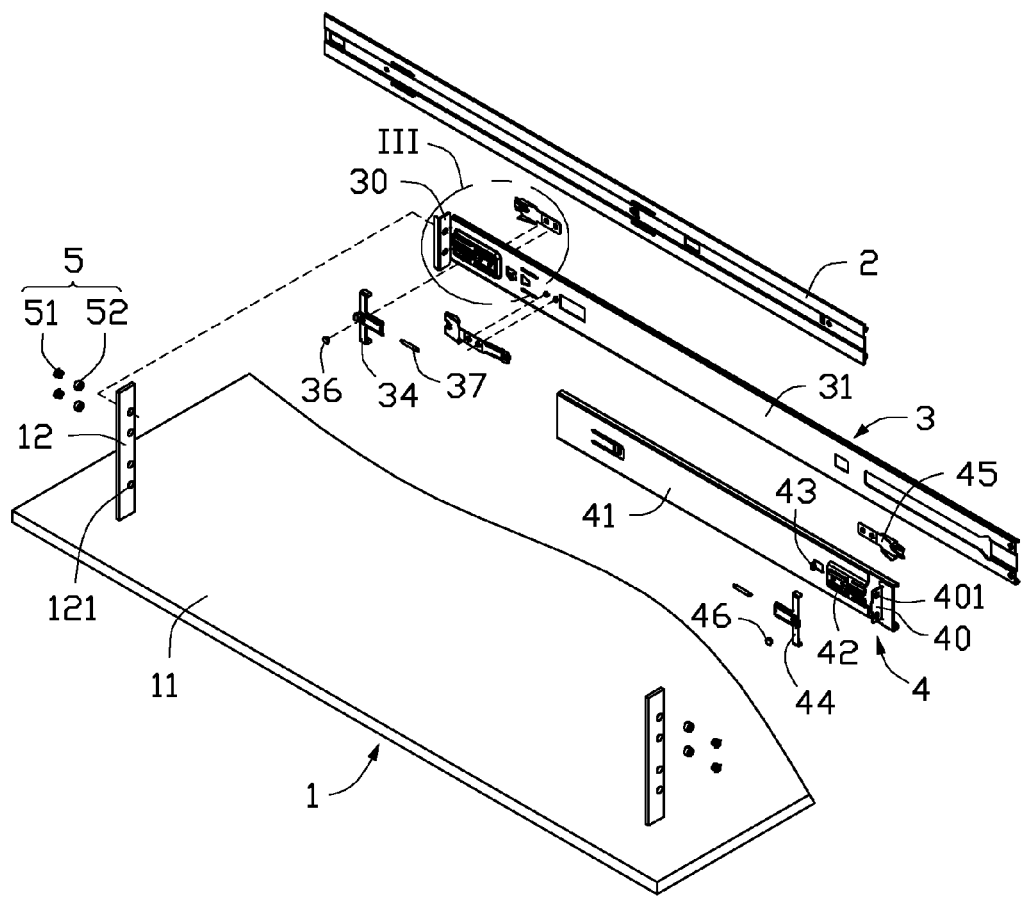
FIG. 1 is an exploded, isometric view of a rail mounting mechanism in accordance with an embodiment.
Figure 2:
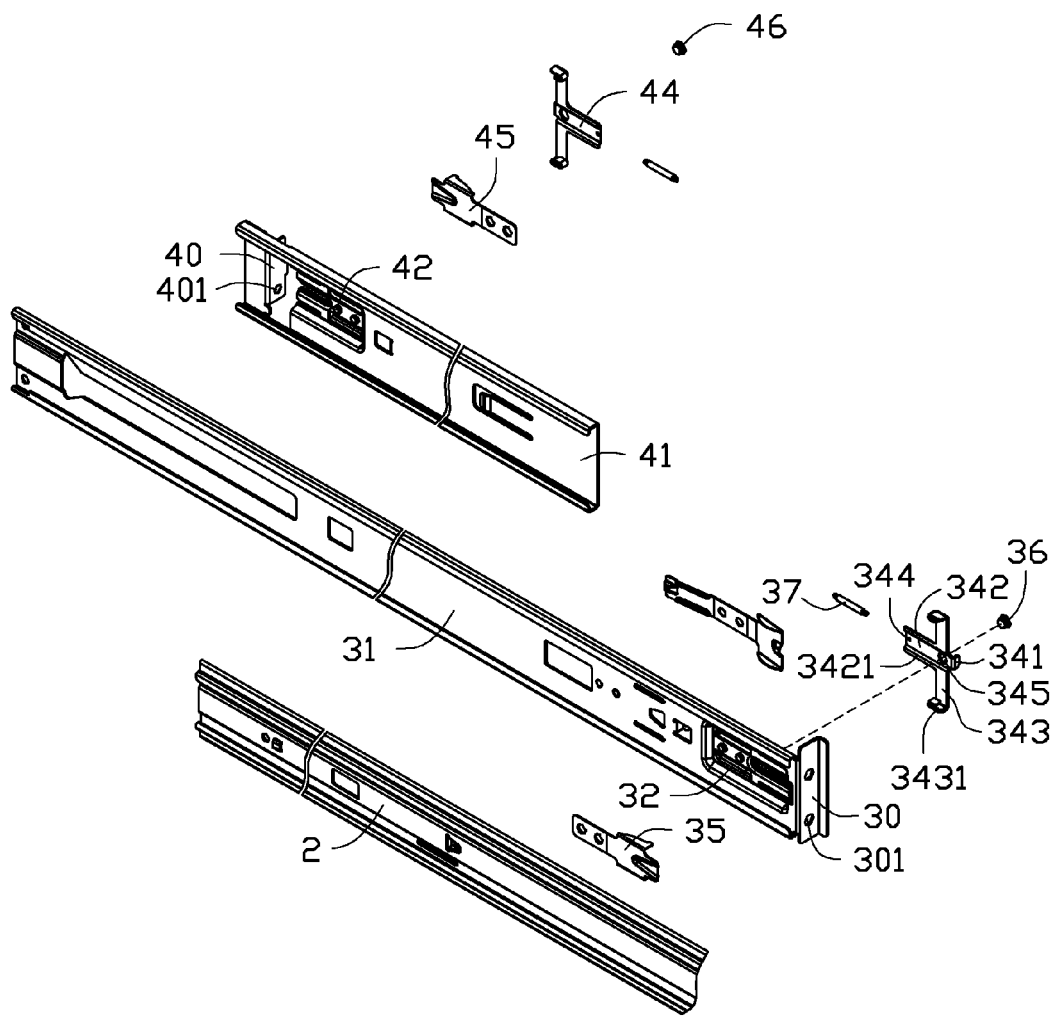
FIG. 2 is an isometric view of a rail, a first guide way, a second guide way of the rail mounting mechanism of FIG. 1.
Figure 3:
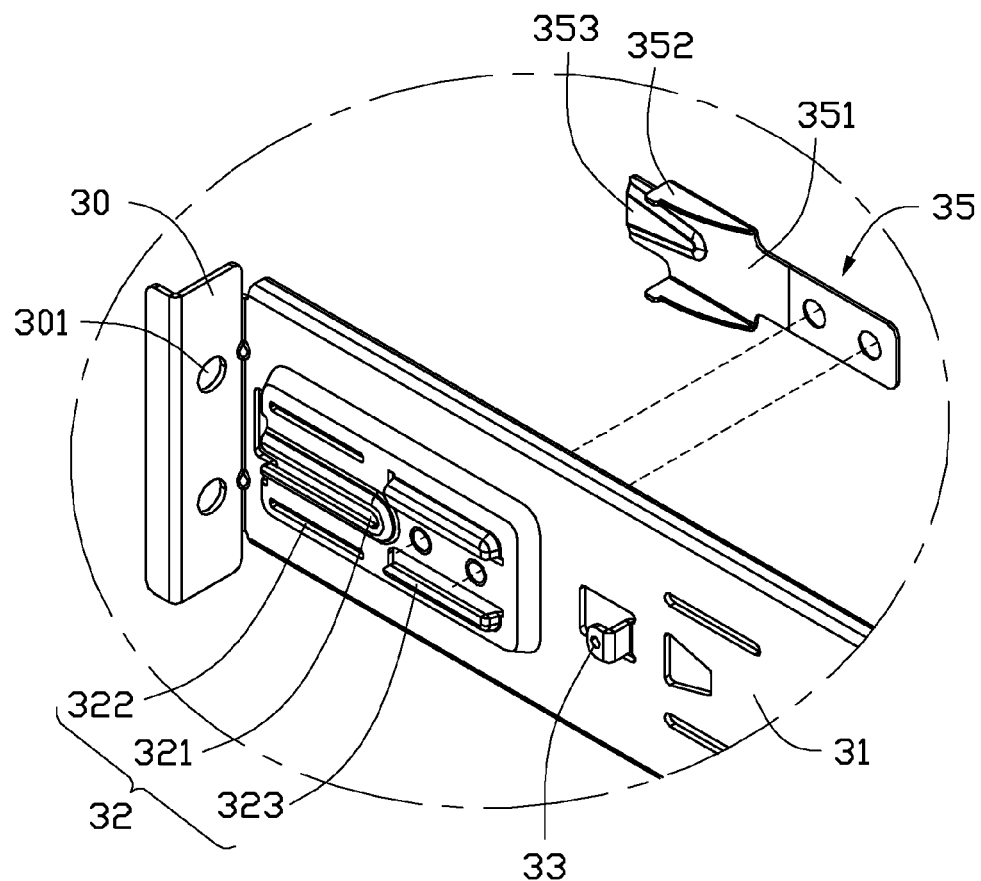
FIG. 3 is an enlarged view of a circled portion III of FIG. 1.

Referring to FIGS. 1-3, a rail mounting mechanism in accordance with an embodiment comprises a base 1, a first guide way 3, and a second guide way 4.

Figure 4:
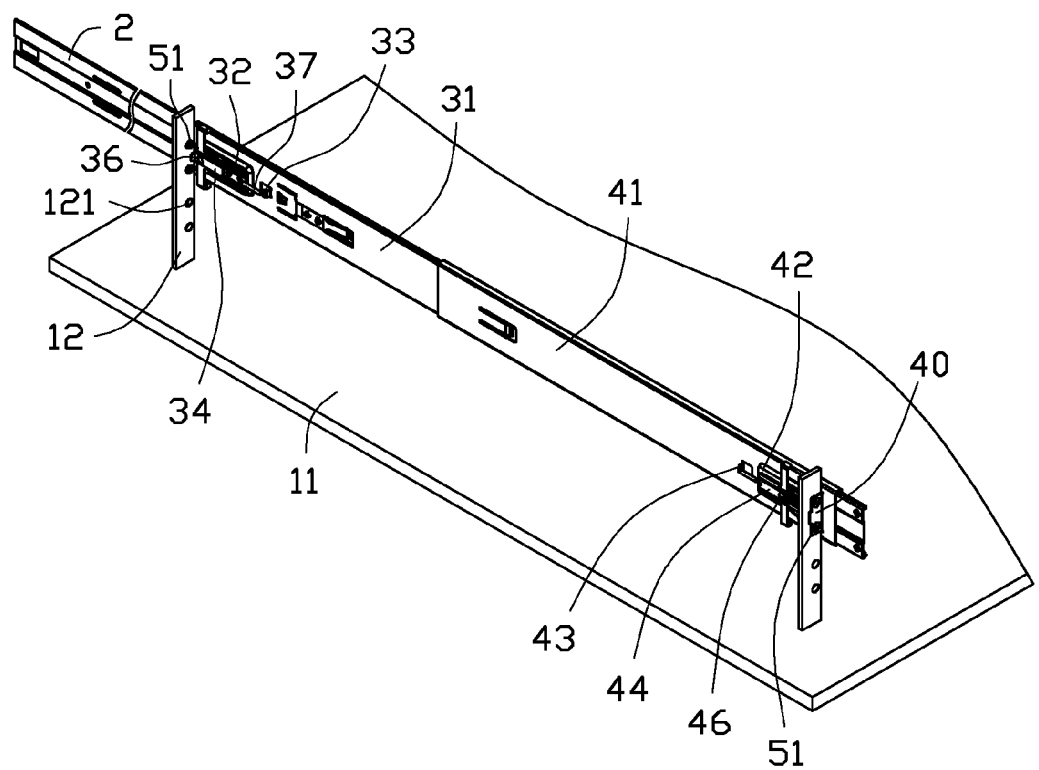
FIG. 4 is an isometric view of assembling the rail mounting mechanism of FIG. 1.
Figure 5:
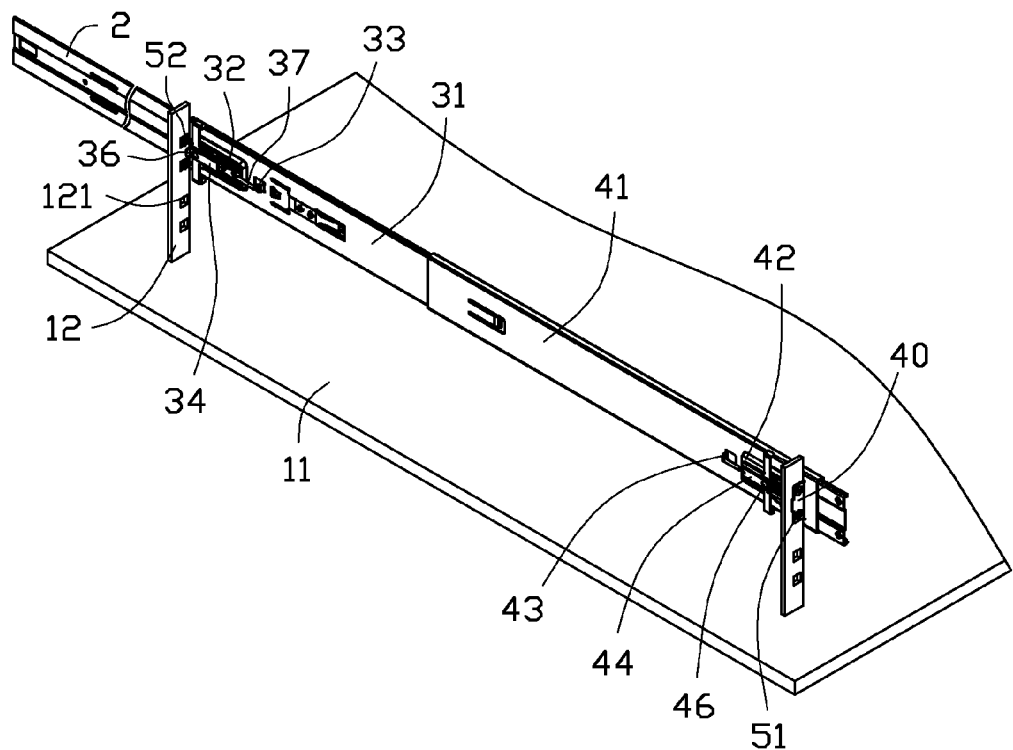
FIG. 5 is similar to FIG. 4, but shows a base in accordance with a second embodiment.

The base 1 comprises a base board 11 and two supports 12 secured substantially perpendicularly to the base board 11. Each of the two supports 12 defines a plurality of positioning holes 121 along a lengthwise direction of the supports 12. In one embodiment, the positioning holes 121 are substantially circular (shown in FIG. 1 and FIG. 4). In another embodiment, the positioning holes 121 are substantially rectangular (shown in FIG. 5).

The first guide way 3 comprises a first guide body 31, a first mounting piece 30 extending substantially perpendicularly from a front end of the first guide body 31, a first latching assembly 32, and a first lock 33. The first mounting piece 30, the first latching assembly 32, and the first lock 33 are located at an outer side of the first guide body 31. The first latching assembly 32 is located between the first mounting piece 30 and the first lock 33. The first mounting piece 30 defines two first mounting holes 301. The first latching assembly 32 defines a sliding slot 321 adjacent to the first mounting piece 30. A length of the sliding slot 321 is substantially half a length of the first latching assembly 32. Two positioning slits 322 are defined in the first latching assembly 32 at opposite sides of the sliding slot 321. A first extending direction of the sliding slot 321 and the two positioning slits 322 is substantially parallel to a top edge of the first guide body 31. A distance between each of the two positioning slits 322 and the guiding slot 321 is substantially the same, and a length of each of the two positioning slits 322 is less than a length of the guiding slot 321. Two positioning pieces 323 extend from an outer surface of the first guide body 31. A second extending direction of the two positioning pieces 323 is substantially parallel to the first extending direction of the guiding slot 321, and a length of each of the two positioning pieces 323 is slightly less than a length of the guiding slot 321. A receiving space (not labeled) is defined between the two positioning pieces 323.

Referring to FIG. 2, a first sliding member 34 is slidably secured to the first latching assembly 32. In one embodiment, the first sliding member 34 is substantially T-shaped. The first sliding member 34 comprises a sliding body 342 and two arm pieces 343 extending from two sides adjacent to an end of the sliding body 342. A length of the sliding body 342 is greater than a length of a positioning piece 323. Two positioning flanges 3421 extend inward from a top edge and a bottom edge, respectively, of the sliding body 342. The positioning flanges 3421 are received in the receiving space defined between the two positioning pieces 323. Two tongues 3431 extend inward from a distal end of the two arm pieces 343, respectively. The two tongues 3431 are configured for bounding a top edge and a bottom edge of the first guide body 31. A pressing tab 341 extends outwardly from a front edge of the sliding body 342 between the two arm pieces 343. An installation hole 345 is defined in the sliding body 342 adjacent to the pressing tab 341. The sliding body 342 defines a through hole 344 adjacent to a front edge of the sliding body 342.

A first positioning member 35 is located on an inner surface of the first guide body 31 and is slidably secured to the first latching assembly 32. The first positioning member 35 comprises a positioning body 351 and two side flanges 352 extending substantially perpendicularly from two side edges of a front portion of the positioning body 351. A protrusion portion 353 protrudes from the positioning body 351 between the two side flanges 352. A distance between the two side flanges 352 is substantially equal to a distance between the two positioning slits 322. An outer edge of each of the two side flanges 352 is arcuate. A length of each of the two side flanges 352 is substantially equal to the length of the positioning slits 322.

Referring to FIGS. 1-3, in assembly of the first guide way 3, the first sliding member 34, and the first positioning member 35, the first sliding member 34 is attached to the outer surface of the first guide body 31 of the first guide way 3. The two positioning flanges 3421 of the first sliding member 34 are received in the receiving space between the two positioning pieces 323, and the two tongues 3431 are positioned at the top edge and the bottom edge of the first guide body 31. The installing hole 345 is aligned with the sliding slot 321. A first installing member 36 is received in the installing hole 345 and the sliding slot 321 to slidably install the first sliding member 34 to the first guide body 31 of the first guide way 3. An end of a first resilient member 37 is secured to the first lock 33 or a hole defined in the first lock 33, and an opposite end of the first resilient member 37 is secured to the through hole 344 of the first sliding member 34. When the first sliding member 34 is slid, the first installing member 36 is slid along the guiding slot 321, and the first resilient member 37 is resilient deformed. The first resilient member 37 may be an extension spring, for example. The first positioning member 35 is secured to the first latching assembly 32 and secured on the inner surface of the first guide body 31 by two fasteners, such as screws. The two side flanges 352 are received through the two positioning slits 322.

The first sliding member 34 is slidable between a first position and a second position on the first guide body 31. When the first sliding member 34 is in the first position, each of the two side flanges 352 is located between each of the two arm pieces 343 and the first mounting piece 30, and the first resilient member 37 has a first length. In addition, when the first sliding member 34 is in the first position, the two arm pieces 343 are blocked by the two positioning pieces 323, and/or the first installing member 36 is blocked by a front end of the first guiding slot 321. When the first sliding member 34 is in the second position, each of the two arm pieces 343 is blocked by each of the two side flanges 352 and located between each of the two side flanges 352 and the first mounting piece 30, and the first resilient member 37 is resiliently deformed to have a second length, which is greater than the first length of the first resilient member 37. When the first sliding member 34 is slid from the first position to the second position, the two arm pieces 343 press the two side flanges 352 to resiliently deform the first positioning member 35 inwardly, so that the two arm pieces 343 can pass across the two side flanges 352. To slide the first sliding member 34 from the second position to the first position, the first positioning member 35 is deformed inward until the two arm pieces 343 cannot be blocked by the two side flanges 352, such that the first resilient member 37 resiliently restores to slide the first sliding member 34 from the second position to the first position. The arcuate shape of the two side flanges 352 help guide the first sliding member 34 slide from the first position to the second position.

The second guide way 4 comprises a second guide body 41, a second mounting piece 40 extending substantially perpendicularly from a rear end portion of the second guide body 41, a second latching assembly 42, and a second lock 43. Two second mounting holes 401 are defined in the second mounting piece 40. The structures of the second mounting piece 40, the second latching assembly 42, and the second lock 43 are substantially similar to the structures of the first mounting piece 30, the first latching assembly 32, and the first lock 33. A second sliding member 44 is attached to the second latching assembly 42 on an outer surface of the second guide body 41 by a second installing member 46. A second positioning member 45 is secured to the second latching assembly 42 on an inner surface of the second guide body 41. The second sliding member 44, the second positioning member 45, and the second installing member 46 are substantially similar to the first sliding member 34, the first positioning member 35, and the first installing member 36. The assembly and operation of the second guide way 4, the second sliding member 44, the second positioning member 45, and the second installing member 46 is substantially similar to the assembly and operation of the first guide way 3, the first sliding member 34, the first positioning member 35, and the first installing member 36 as described above.

Referring to FIGS. 1-5, in assembly, two latches 5 are securely received in the two first mounting holes 301 of the first mounting piece 30. The first guide way 3 is slidably secured to the second guide way 4. A rail 2 is slidably secured to the first guide way 3. When the first sliding member 34 is in the first position, the first guide way 3 and the second guide way 4 are then attached to the two supports 12. The two latches 5 are aligned with two of the plurality of positioning holes 121 of the support 12. The support 12 is located between the first sliding member 34 and the first mounting piece 30. The first guide way 3 is slid relative to the support 12 so that the two latches 5 are engagingly received in the two positioning holes 121. The first sliding member 34 is slid from the first position to the second position to abut the support 12 of the two latches 5 to prevent the two latches 5 from moving out of the two positioning holes 121. Therefore, the first guide way 3 is secured to the support 12.

In an embodiment, each of the two latches 5 comprises a first latch portion 51 and a second latch portion 52. The first latch portion 51 is received through the first mounting hole 301 of the first mounting piece 30, and the second latch portion 52 is secured to the first latch portion 51 to secure the latch 5 to the first mounting piece 30. The second latch portion 52 can be engaged in the positioning hole 121 of the support 12.

To remove the first guide way 3 from the base 1, the first sliding member 34 is slid from the second position to the first position, and the two latches 5 are removed from the two positioning holes 121. Thus, the first guide way 3 is easily removed from the support 12.

The assembly and removal of the second guide way 4 is substantially similar to the assembly and removal of the first guide way 3. So, the assembly and removal of the second guide way 4 to another support 12 is not described in detail.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A rail mounting mechanism, comprising:
   a base comprising a base board and a support located on the base board, and the support defines a positioning hole;
   a guide way configured for slidably receiving a rail; the guide way comprises a guide body and a mounting piece located on the guide body; the guide body defines a positioning slit; and a latch, located on the mounting piece, is detachably engaged in the positioning hole;
   a sliding member slidably installed on an outer surface of the guide body, and the sliding member comprises an arm piece;
   a positioning member secured to an inner surface of the guide body, and the positioning member comprises a side flange aligned with the positioning slit;
   wherein the sliding member is slidable between a first position and a second position; when the sliding member is in the first position, the side flange is inserted through the positioning slit and located between the arm piece and the mounting piece;
   and when the sliding member is in the second position, the arm piece is located between the side flange and the mounting piece and is blocked by the side flange, and the arm piece prevents the latch removing from the positioning hole.

2. The rail mounting mechanism of claim 1, wherein the sliding member further comprises a sliding body, the arm piece extends from the sliding body, the sliding body defines an installing hole, the guide body defines a sliding slot, and an installing member is engaged in the installing hole and the sliding slot to slidably install the sliding member to the guide body.

3. The rail mounting mechanism of claim 1, wherein two positioning pieces are located on the guide body, the sliding member further comprises a sliding body, the arm piece extends from the sliding body, and the sliding body are slidably received between each of the two positioning pieces and the guide body to slidably install the sliding member to the guide body.

4. The rail mounting mechanism of claim 1, wherein the positioning member is resiliently deformed to disengage the side flange from the arm piece when the sliding member is in the second position.

5. The rail mounting mechanism of claim 4, wherein the sliding member further comprises a sliding body, a resilient member is secured to the sliding body and the guide body, and when the side flange is disengaged from the arm piece, the resilient member returns to slide the sliding member from the second position to the first position.

6. The rail mounting mechanism of claim 5, wherein the arm piece extends from the sliding body, the sliding body defines a through hole, a lock is located on the guide body, one end of the resilient member is engaged in the through hole, and an opposite end of the resilient member is engaged with the lock.

7. The rail mounting mechanism of claim 1, wherein the mounting piece is substantially perpendicular to the guide body.

8. The rail mounting mechanism of claim 1, wherein the side flange is slanted or arc-shaped for the sliding member sliding easily from the first position to the second position.

9. A rail mounting mechanism, comprising:
a base comprising a base board and a support perpendicularly located on the base board; and the support defining a positioning hole;
a guide way configured for slidably receiving a rail; the guide way comprises a guide body and a mounting piece located on the guide body; and a latch, located on the mounting piece, is detachably engaged in the positioning hole;
a sliding member slidably installed on an outer surface of the guide body; and the sliding member comprises an arm piece;
a positioning member secured to an inner surface of the guide body; and the positioning member comprises a side flange aligned;
wherein the sliding member is slidable between a first position and a second position; when the sliding member is in the first position, the side flange is located between the arm piece and the mounting piece; and when the sliding member is in the second position, the arm piece is located between the side flange and the mounting piece and is blocked by the side flange, and the arm piece prevents the latch removing from the positioning hole.

10. The rail mounting mechanism of claim 9, wherein the sliding member further comprises a sliding body, the arm piece extends from the sliding body, the sliding body defines an installing hole, the guide body defines a sliding slot, and an installing member is engaged in the installing hole and the sliding slot to slidably install the sliding member to the guide body.

11. The rail mounting mechanism of claim 9, wherein two positioning pieces are located on the guide body, the sliding member further comprises a sliding body, the arm piece extends from the sliding body, and the sliding body are slidably received between each of the two positioning pieces and the guide body to slidably install the sliding member to the guide body.

12. The rail mounting mechanism of claim 9, wherein the positioning member is resiliently deformed to disengage the side flange from the arm piece when the sliding member is in the second position.

13. The rail mounting mechanism of claim 9, wherein the sliding member further comprises a sliding body, a resilient member is secured to the sliding body and the guide body, and when the side flange is disengaged from the arm piece, the resilient member returns to slide the sliding member from the second position to the first position.

14. The rail mounting mechanism of claim 13, wherein the arm piece extends from the sliding body, the sliding body defines a through hole, a lock is located on the guide body, one end of the resilient member is engaged in the through hole, and an opposite end of the resilient member is engaged with the lock.

15. The rail mounting mechanism of claim 9, wherein the guide body defines a sliding slot, the guide body defines a positioning slit, the side flange is aligned with the positioning slit, and when the sliding member is in the first position or the second position, the side flange is inserted through the positioning slit.

16. A rail mounting mechanism, comprising:
a support;
a guide way configured for slidably receiving a rail; the guide way comprises a guide body and a mounting piece located on the guide body; and the mounting piece is detachably engaged with the support;
a sliding member slidably installed on an outer surface of the guide body; the sliding member comprises a sliding body and an arm piece extending from the sliding body; and
a resilient member is secured to the sliding body and the guide body;
a positioning member secured to an inner surface of the guide body; and the positioning member comprising a side flange aligned;
wherein the sliding member is slidable between a first position and a second position; when the sliding member is in the first position, the side flange is located between the arm piece and the mounting piece; and when the sliding member is in the second position, the arm piece is located between the side flange and the mounting piece and is blocked by the side flange, and the arm piece prevents the mounting piece disengaging from the support; the resilient member is resilient deformed when the sliding member is in the second position, and when the arm piece is disengaged from the side flange, the resilient member returns to slide the sliding member from the second position to the first position.

17. The rail mounting mechanism of claim 16, wherein the sliding body defines an installing hole, the guide body defines a sliding slot, and an installing member is engaged in the installing hole and the sliding slot to slidably install the sliding member to the guide body.

18. The rail mounting mechanism of claim 16, wherein two positioning pieces are located on the guide body, and the sliding body are slidably received between each of the two positioning pieces and the guide body to slidably install the sliding member to the guide body.

19. The rail mounting mechanism of claim 16, wherein the positioning member is resiliently deformed to disengage the side flange from the arm piece when the sliding member is in the second position.

20. The rail mounting mechanism of claim 16, wherein the guide body defines a sliding slot, the guide body defines a positioning slit; the side flange is aligned with the positioning slit, and when the sliding member is in the first position or the second position, the side flange is inserted through the positioning slit.

* * * * *